(12) United States Patent
Lee et al.

(10) Patent No.: US 10,096,697 B2
(45) Date of Patent: Oct. 9, 2018

(54) III-V FIN GENERATION BY LATERAL GROWTH ON SILICON SIDEWALL

(71) Applicant: International Business Machines Corporation, Armonk, NY (US)

(72) Inventors: Sanghoon Lee, White Plains, NY (US); Brent A. Wacaser, Putnam, NY (US); Devendra K. Sadana, Pleasantville, NY (US); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/874,208

(22) Filed: Jan. 18, 2018

(65) Prior Publication Data

US 2018/0145154 A1   May 24, 2018

Related U.S. Application Data

(62) Division of application No. 14/876,986, filed on Oct. 7, 2015.

(51) Int. Cl.
*H01L 29/66* (2006.01)
*H01L 21/02* (2006.01)

(52) U.S. Cl.
CPC .... *H01L 29/66795* (2013.01); *H01L 21/0245* (2013.01); *H01L 21/02422* (2013.01); *H01L 21/02538* (2013.01)

(58) Field of Classification Search
CPC ................................................ H01L 29/66795
See application file for complete search history.

(56) References Cited

U.S. PATENT DOCUMENTS

| 4,948,456 | A  | 8/1990 | Schubert |
| 5,281,283 | A  | 1/1994 | Tokunaga et al. |
| 7,705,345 | B2 | 4/2010 | Bedell et al. |
| 8,937,299 | B2 | 1/2015 | Basu et al. |
| 9,040,331 | B2 | 5/2015 | Lochtefeld |
| 2004/0099871 | A1 | 5/2004 | Izumi et al. |
| 2012/0025201 | A1 | 2/2012 | Wann et al. |
| 2015/0123166 | A1 | 5/2015 | Jacob et al. |

(Continued)

FOREIGN PATENT DOCUMENTS

WO   2015047244 A1   4/2015

OTHER PUBLICATIONS

S.C. Lee, et al.; "Growth of GaN on a nanoscale periodic faceted Si substrate by metal organic vapor phase epitaxy"; IEEE; 2004; 0-7803-8614-0/04; whole document (7 pages).

(Continued)

*Primary Examiner* — Marvin Payen
(74) *Attorney, Agent, or Firm* — Harrington & Smith; Louis J. Percello

(57) ABSTRACT

A method comprises providing a structure defined by a silicon material on a buried oxide layer of a substrate; causing a nucleation of a III-V material in a sidewall of the structure defined by the silicon material; adjusting a growth condition to facilitate a first growth rate of the III-V material in directions along a surface of the sidewall and a second growth rate of the III-V material in a direction laterally from the surface of the sidewall, wherein the second growth rate is less than the first growth rate; and processing the silicon material and the III-V material to form a fin.

16 Claims, 12 Drawing Sheets

(56) References Cited

U.S. PATENT DOCUMENTS

2016/0204276 A1    7/2016   Dasgupta

OTHER PUBLICATIONS

M. Deura, et al.; "Twin-free InGaAs thin layer on Si by multi-step growth using micro-channel selective-area MOVPE"; Journal of Crystal Growth 312 (2010); pp. 1353-1358.
"List of IBM Patents or Patent Applicatoins Treated as Related", Jan. 2018, 2 pgs.

III-V FIN GENERATION BY LATERAL GROWTH ON SILICON SIDEWALL

CROSS REFERENCE TO RELATED APPLICATION

This patent application is a divisional application of copending U.S. patent application Ser. No. 14/876,986, filed on Oct. 7, 2015, the disclosure of which is incorporated by reference herein in its entirety.

BACKGROUND

The exemplary embodiments of this invention relate generally to semiconductor devices and techniques for the fabrication thereof and, more specifically, to the fabrication of fin-type transistor devices having channels of III-V materials.

Semiconductors and integrated circuit chips have become widely used in many products due to their decreasing cost and size. In the microelectronics industry there is a continued desire to reduce the size of structural features and microelectronic devices in order to provide a greater amount of circuitry on a given chip. Doing so generally allows for increased performance (more processing per clock cycle and less heat generated) at lower power levels and lower cost. However, the present technology is at or approaching atomic level scaling of certain micro-devices.

One type of microelectronic device that is continually being reduced in size is a field effect transistor (FET), which is generally defined by a source, a gate, and a drain. The action of the FET depends on the flow of majority carriers along a channel that runs past the gate and between the source and drain. Current through the channel between the source and drain may be controlled by a transverse electric field under the gate.

The size of a FET can be reduced by forming the channel in the shape of a fin. A FET employing such a channel structure may be referred to as a finFET. The fin-shaped channels (or "fins") may be fabricated of, for example, germanium or III-V materials.

Such fins may be fabricated on silicon substrates. The fabrication of defect-free III-V fins on a silicon substrate, however, may be difficult. Current III-V heterogeneous epitaxy techniques (such as aspect ratio trapping and graded buffer growth) and other deposition techniques generally utilize relatively thick buffers of III-V materials (e.g., more than several hundreds of nanometers) and tend to result in the fabricated fins having large numbers of defects.

BRIEF SUMMARY

In one exemplary aspect, a method comprises providing a structure defined by a silicon material on a buried oxide layer of a substrate; causing a nucleation of a III-V material in a sidewall of the structure defined by the silicon material; adjusting a growth condition to facilitate a first growth rate of the III-V material in directions along a surface of the sidewall and a second growth rate of the III-V material in a direction laterally from the surface of the sidewall, wherein the second growth rate is less than the first growth rate; and processing the silicon material and the III-V material to form a fin.

In another exemplary aspect, a method comprises providing a structure defined by a silicon material on a buried oxide layer of a substrate, the structure having at least one sidewall perpendicular to a surface of the buried oxide layer and a top surface parallel to the surface of the buried oxide layer; disposing a discontinuous oxide mask on the at least one sidewall of the structure to define at least one seed area at at least one discontinuity in the oxide mask; causing a nucleation of a III-V material in the at least one seed area; adjusting a growth condition to facilitate a first growth rate of the III-V material along the sidewall and a second growth rate of the III-V material lateral to the sidewall, wherein the second growth rate is less than the first growth rate; processing the silicon material and the III-V material to form a fin; and disposing a gate over the formed fin.

In another exemplary aspect, a method comprises forming a mandrel on a buried oxide layer on a silicon substrate, the forming of the mandrel being by a facet-selective wet etch of a (110) silicon material, the mandrel having at least one sidewall perpendicular to a surface of the buried oxide layer, the sidewall having a top surface extending in a <110> direction orthogonal to the surface of the buried oxide layer and a side surface extending in a <111> direction parallel to a surface of the buried oxide layer; disposing an oxide mask on the at least one sidewall of the mandrel in the <111> direction to define at least one seed area; causing a growth of a III-V material on the at least one sidewall of the mandrel from the at least one seed area in the <110> and <112> directions and in the <111> direction; adjusting a growth condition to facilitate a faster growth rate of the III-V material in the <110> and <112> directions and a slower growth rate in the <111> direction; processing the (110) silicon material and the III-V material to form a fin; and disposing a gate stack over the formed fin.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

As used herein, the term "III-V" refers to inorganic crystalline compound semiconductors having at least one Group III element and at least one Group V element. Exemplary III-V materials for use in the structures and methods described herein include, but are not limited to, gallium arsenide (GaAs), aluminum arsenide (AlAs), gallium phosphide (GaP), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP), and combinations of the foregoing.

Figure 1:
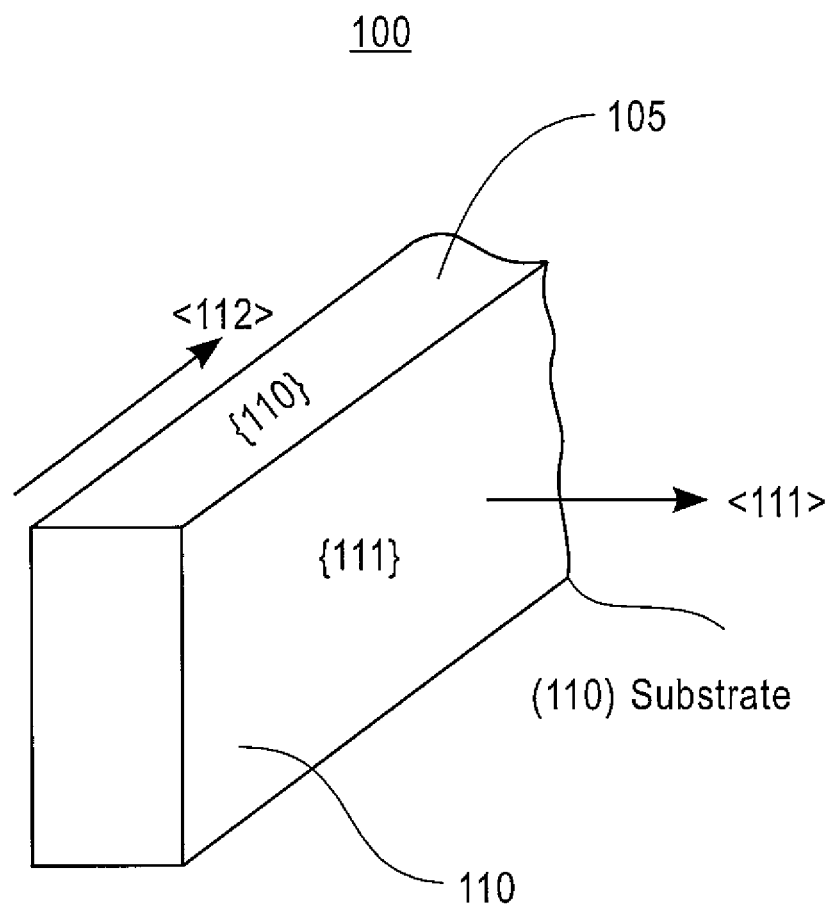
FIG. 1 is a perspective schematic representation of a portion of a silicon mandrel on which fins may be grown.

As shown in FIG. 1, one exemplary embodiment of a structure for use in fabricating a finFET or a fin-type transistor device having active areas (such as channels) formed by III-V material(s) is designated generally by the reference number 100. The structure comprises a mandrel and is hereinafter referred to as "mandrel 100." The mandrel 100 can comprise silicon or other insulative material. In some embodiments illustrated herein, the mandrel 100 is a silicon substrate of silicon-on-insulator (SOI) material or bulk material having a (110) crystal configuration. Because of the (110) configuration of the silicon forming the mandrel 100, the silicon of the mandrel 100 would have a top surface 105 having crystal orientations of {110} and sidewalls 110 having crystal orientations of {111}.

Referring to FIGS. 2-22, exemplary embodiments of methods of fabricating a finFET or a fin-type device having one or more fins using the mandrel and comprising a III-V material are shown.

Figure 2:
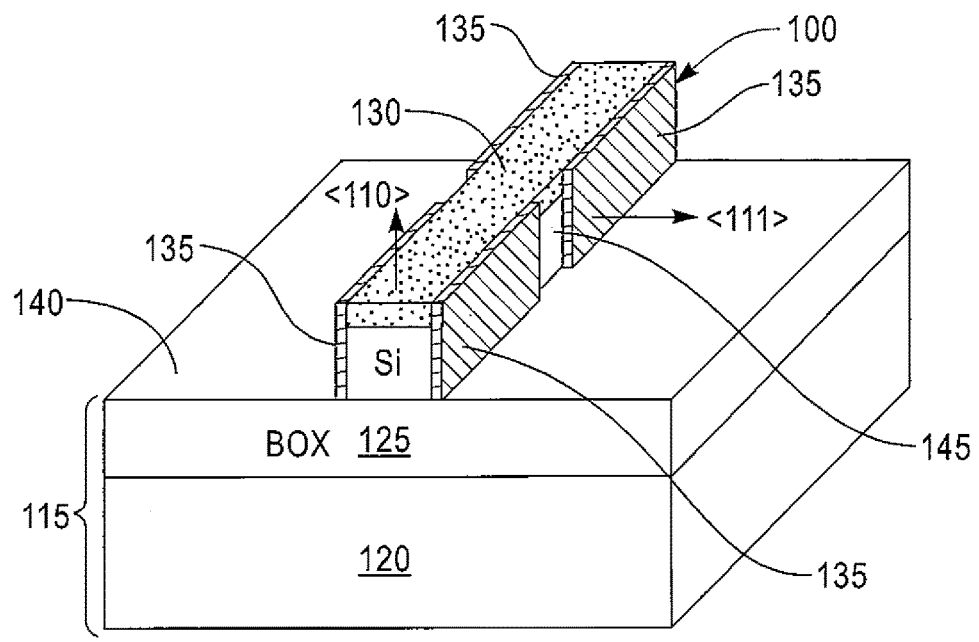
FIG. 2 is a perspective schematic representation of the silicon mandrel of FIG. 1 disposed on a handle wafer comprising an insulating base substrate and an overlying buried oxide layer.
Figure 3:
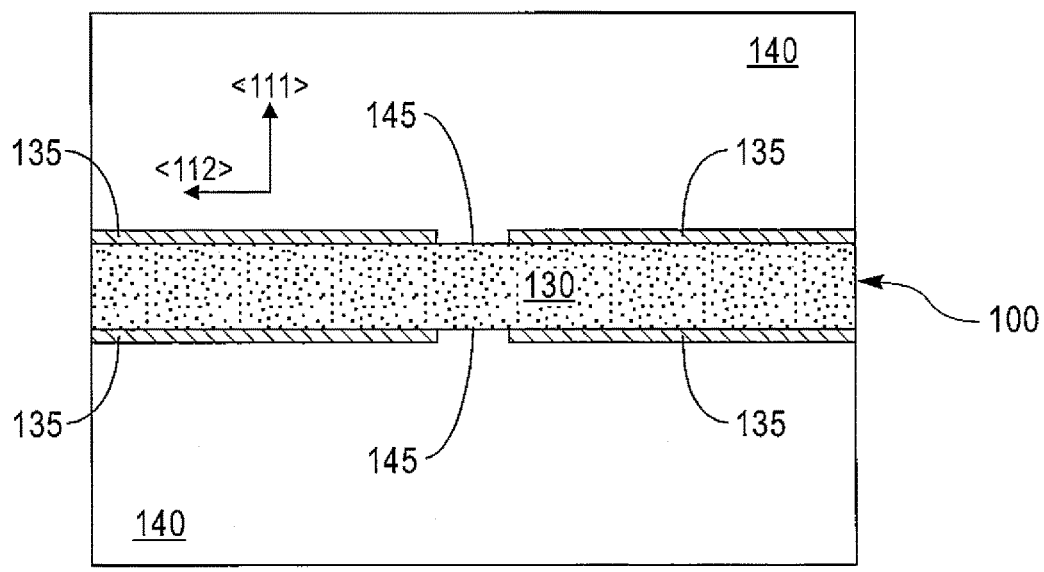
FIG. 3 is a top view of the schematic representation of FIG. 2.

As shown in FIGS. 2 and 3, the mandrel 100 may be disposed on a handle wafer 115 comprising an insulating silicon base substrate 120 having an overlying buried oxide (BOX) layer 125, with the mandrel 100 being disposed directly on the BOX layer 125. The mandrel 100 may comprise the silicon having the (110) configuration with a silicon etch mask/chemical mechanical polish (CMP) stop layer 130 (hereinafter "stop layer 130") disposed on the top surface 105 (in the <110> direction) and one or more sidewall oxide masks 135 (or a discontinuous sidewall oxide mask 135) disposed on portions of the opposing sidewalls in the <111> directions. The stop layer 130 can comprise a silicon nitride ($SiN_x$) such as, for example, SiN, $Si_3N_4$, or the like, or $SiO_2$, or $Al_2O_3$. The sidewall oxide masks 135 can comprise any suitable oxide such as, for example, $SiO_2$, as well as other materials such as silicon nitrides, and are deposited on the sidewall by any suitable deposition technique or by thermal oxidation.

The mandrel 100 may be formed by facet-selective wet etch on a (110) crystalline configuration of the SOI material or the bulk material such that the opposing sidewalls of the mandrel 100 are <111> faceted sidewalls that are perpendicular to an upper surface 140 of the BOX layer 125. The BOX layer 125 may be formed by implantation of oxide ions. A seed area 145 is defined on each sidewall of the mandrel 100 by a gap, break, or discontinuity between sidewall oxide masks 135. If only one sidewall oxide mask 135 is employed, the seed area 145 may be defined by an opening in the sidewall oxide mask 135 or a through hole extending through the material of the sidewall oxide mask 135 down to the sidewall of the mandrel 100. The seed area 145 allows for the generation of nucleations in the III-V material forming the fin in a controlled manner (and without a buffer region between the III-V material and the material of the mandrel 100).

Figure 4:
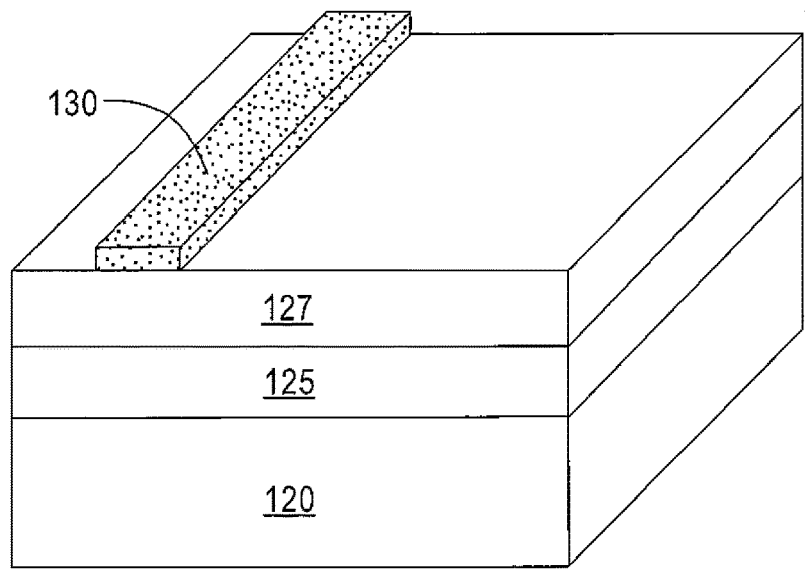
FIGS. 4 and 5 are perspective schematic representations of another exemplary embodiment of a silicon mandrel disposed on a handle substrate.
Figure 5:
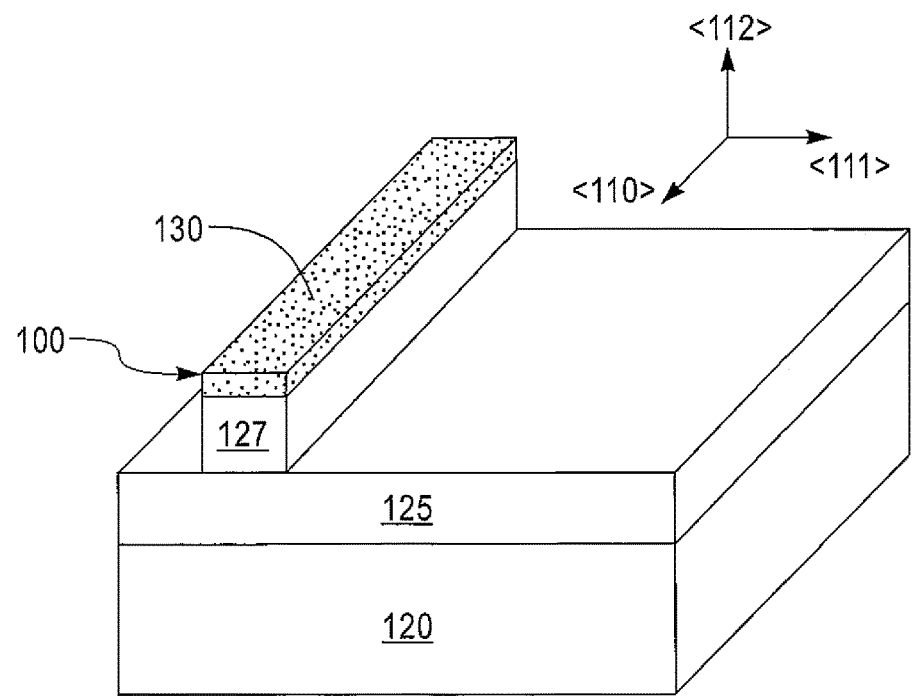

In another exemplary embodiment, as shown in FIGS. 4 and 5, a (112) oriented silicon surface wafer can be used to form the <111> direction sidewall. As shown in FIG. 4, the insulating silicon base substrate 120 having the BOX layer 125 may be provided with an overlying layer of (112) silicon 127 on the BOX layer 125 to form the mandrel 100 of (112) silicon. The stop layer 130 may be disposed on the overlying layer of (112) silicon 127. The stop layer 130 can comprise a silicon nitride ($SiN_x$) such as, for example, SiN, $Si_3N_4$, or the like, or $SiO_2$, or $Al_2O_3$. The overlying layer of (112) silicon 127 may be patterned and masked. As shown in FIG. 5, mandrels 100 that are parallel to the <112> direction may be formed by a dry-etch technique (e.g., $XeF_2$) or an anisotropic wet-etching of the silicon using tetramethylammonium hydroxide (TMAH) or potassium hydroxide (KOH). In such an embodiment, the silicon mandrel 100 is formed with a vertical sidewall that is normal to the <111> direction and that has an atomically flat surface due to the nature of facet-selective etching.

Figure 6:
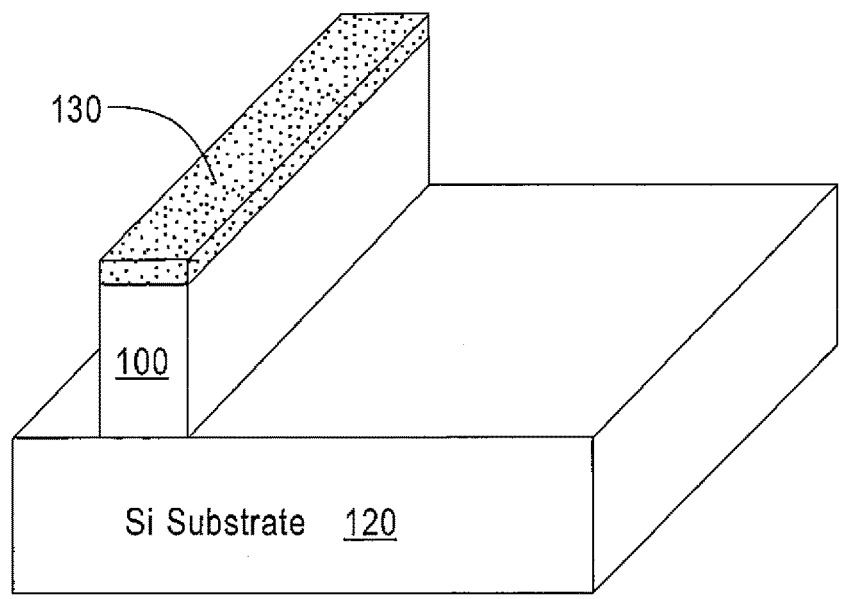
FIGS. 6-9 are perspective schematic representations of other exemplary embodiments of a silicon mandrel disposed on a handle substrate.
Figure 7:
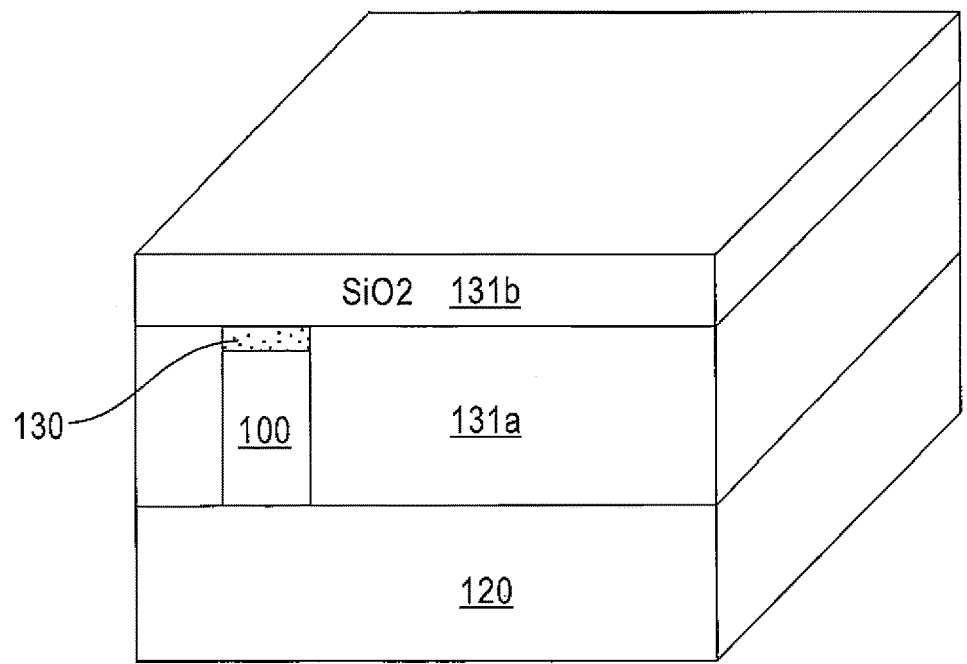
Figure 8:
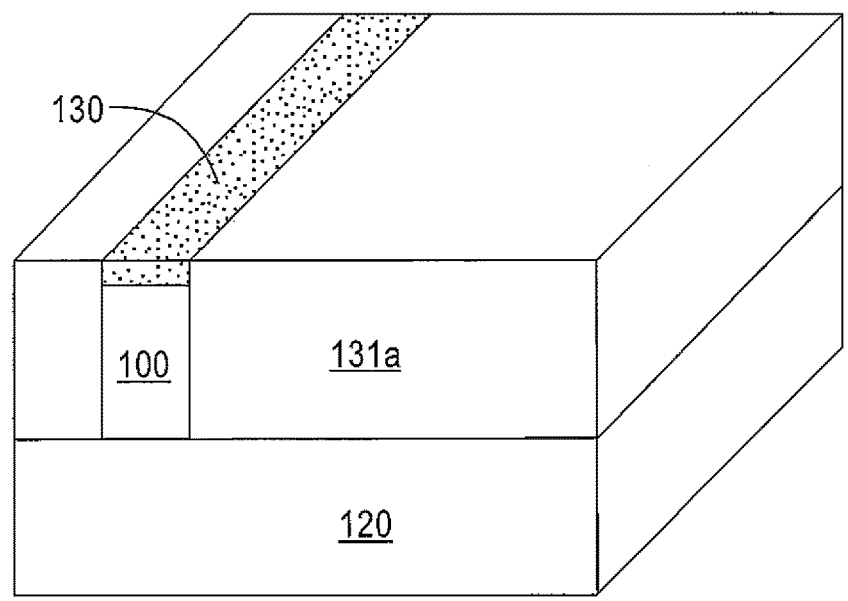
Figure 9:
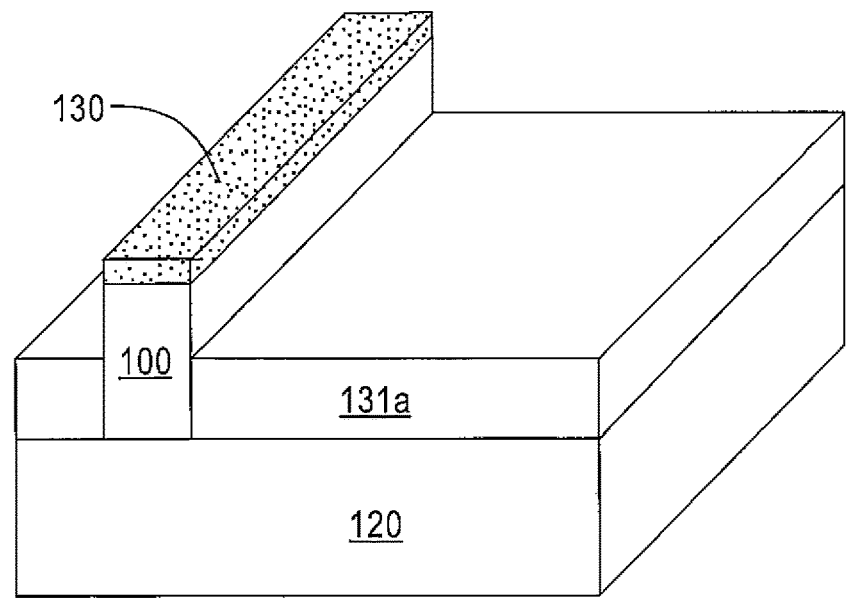

Another exemplary embodiment is shown in FIGS. 6-9. As shown in FIG. 6, the mandrel 100 may be formed using (110) or (112) silicon directly on the silicon base substrate 120 using any suitable anisotropic wet-etch technique (e.g., using TMAH or KOH). As shown in FIG. 7, $SiO_2$ is deposited around the mandrel 100 to form a bottom oxide layer 131a and over the mandrel 100 and the bottom oxide layer 131a to form a top oxide layer 131b. As shown in FIG. 8, the top oxide layer 131b is planarized down to the stop layer 130 and the bottom oxide layer 131a. As shown in FIG. 9, the bottom oxide layer 131a below the stop layer 130 is etched to expose the sidewalls of the mandrel 100. Sidewall oxide masks 135 may be disposed on the sidewalls to form the seed areas 145.

Figure 10:
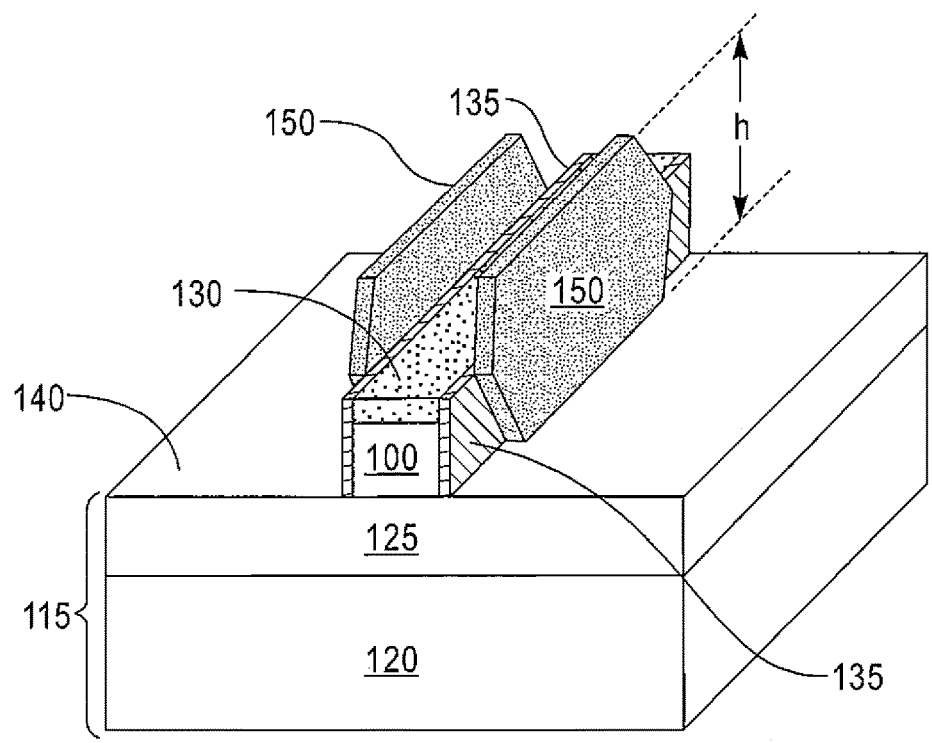
FIG. 10 is perspective schematic representation of the silicon mandrel of FIG. 2 having fins laterally grown on opposing sidewalls.
Figure 11:
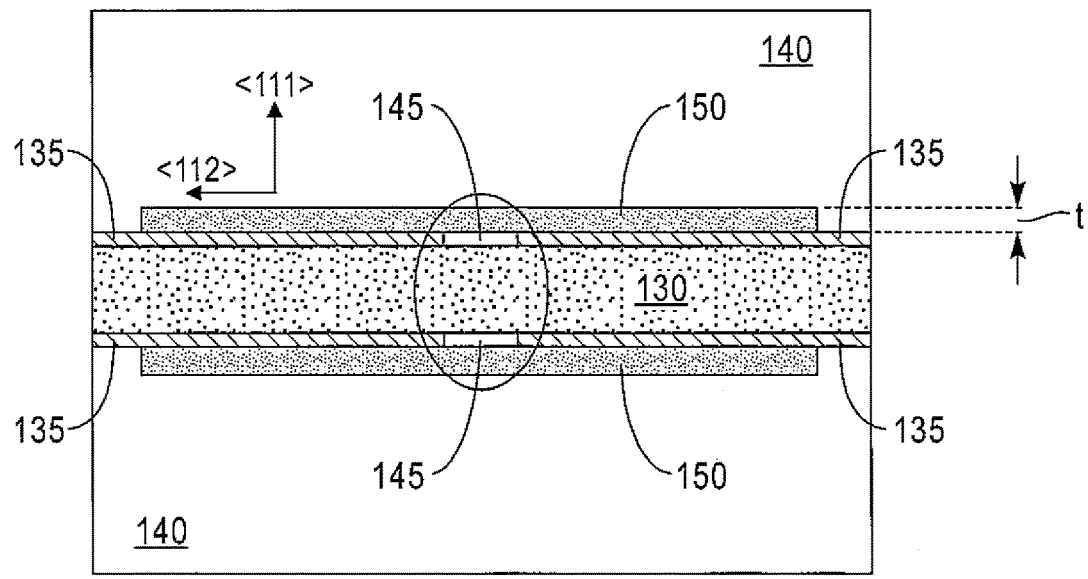
FIG. 11 is a top view of the schematic representation of FIG. 10.

Referring now to FIGS. 10 and 11, the III-V material is laterally grown from the seed areas 145 on the sides of the mandrel 100 to form the active areas. Although the III-V material may be grown from any of the seed areas 145 described above, FIGS. 10 and 11 are depicted to show lateral growth from the seed areas 145 of the mandrel 100 and handle wafer 115 of FIG. 2. Since only a small portion of the silicon of the sidewall of the mandrel 100 is exposed to the III-V material in the seed area 145, growth of the III-V material can be from a single nucleus of III-V material deposited on the (110) configuration of the SOI material or the bulk material at a preselected temperature and pressure to initiate the growth, thereby allowing for high quality growth to be achieved due to the substantial absence of defects that can be generated when two growth fronts merge. Conditions (e.g., temperature, pressure, and the like) are selected and adjusted such that a growth rate of the III-V material in the <110> direction is faster than a growth rate in the <111> direction, which results in a structure on each side of the mandrel 100 to define fins 150, such fins 150 having a height h (FIG. 10) that is substantially greater than a thickness t (FIG. 11).

Figure 12:
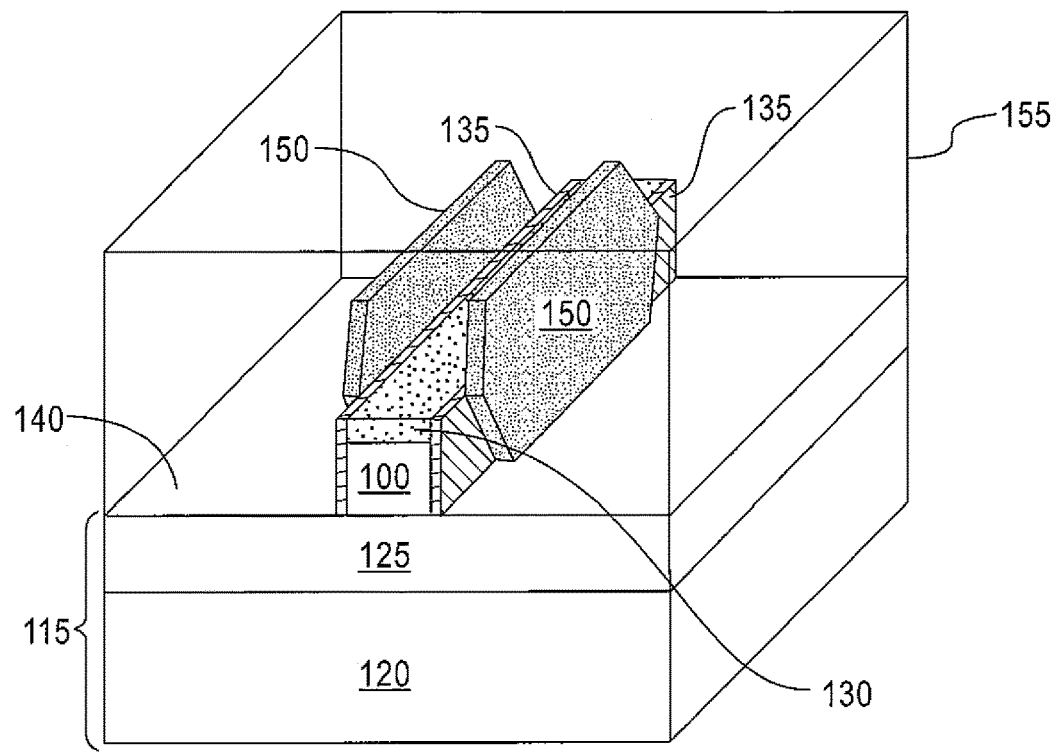
FIG. 12 is a perspective schematic representation of the mandrel and fins of FIG. 10 covered by a field oxide layer.

As shown in FIG. 12, upon growth of the fins 150, a field oxide layer 155 (or equivalent material for CMP) can be disposed on the BOX layer 125 and over the fins 150 and mandrels 100. The field oxide layer 155 can comprise any suitable oxide material (e.g., silicon dioxide, spin-on-glass, or any dielectric material that can be selectively polished to the dielectric on the mandrels 100) for passivating and protecting the surfaces of the BOX layer 125, the fins 150, and the mandrels 100.

Figure 13:
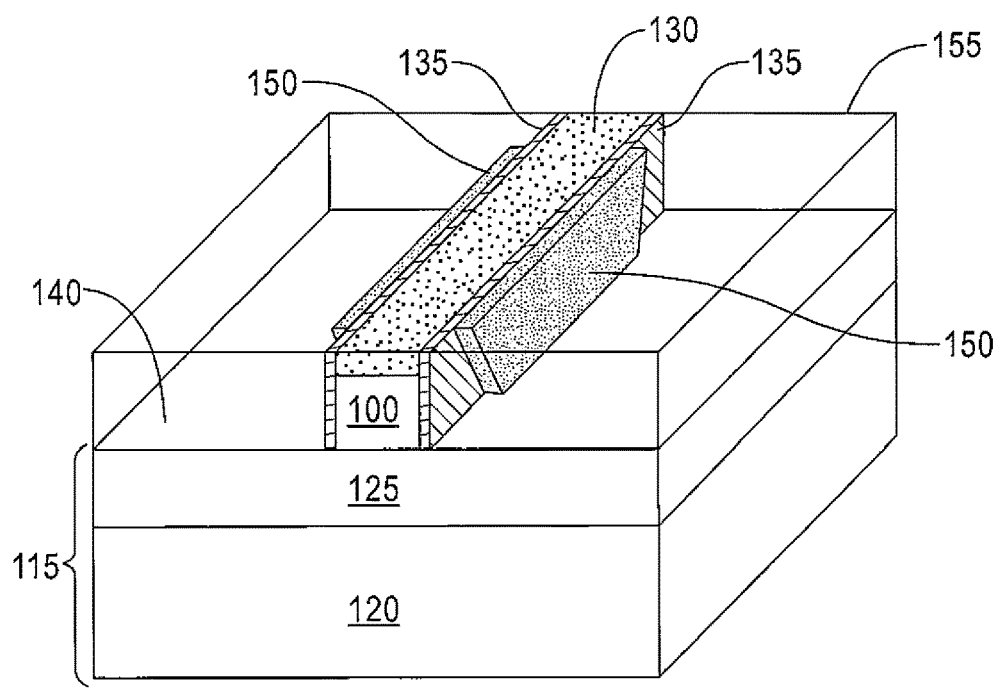
FIG. 13 is a perspective schematic representation of the mandrel, fins, and field oxide layer of FIG. 12 polished down to an upper surface of a stop layer on the mandrel.

As shown in FIG. 13, a CMP process can be carried out on the field oxide layer 155 to planarize the field oxide and the fins 150 down to the surface of the stop layer 130 on the mandrel 100.

Figure 14:
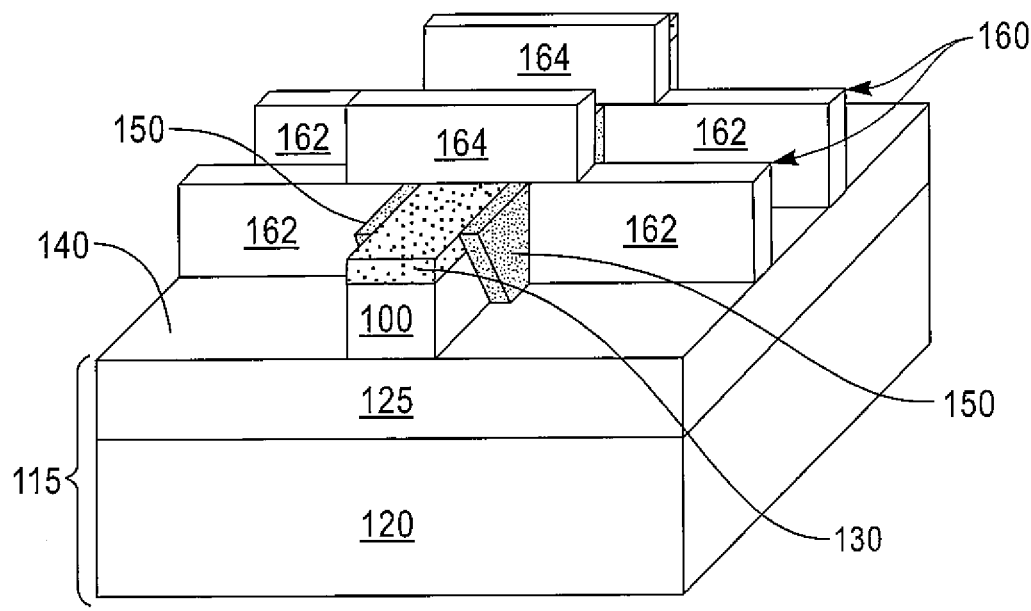
FIG. 14 is a perspective schematic representation of a mandrel/fin arrangement having gate stacks disposed thereon.
Figure 15:
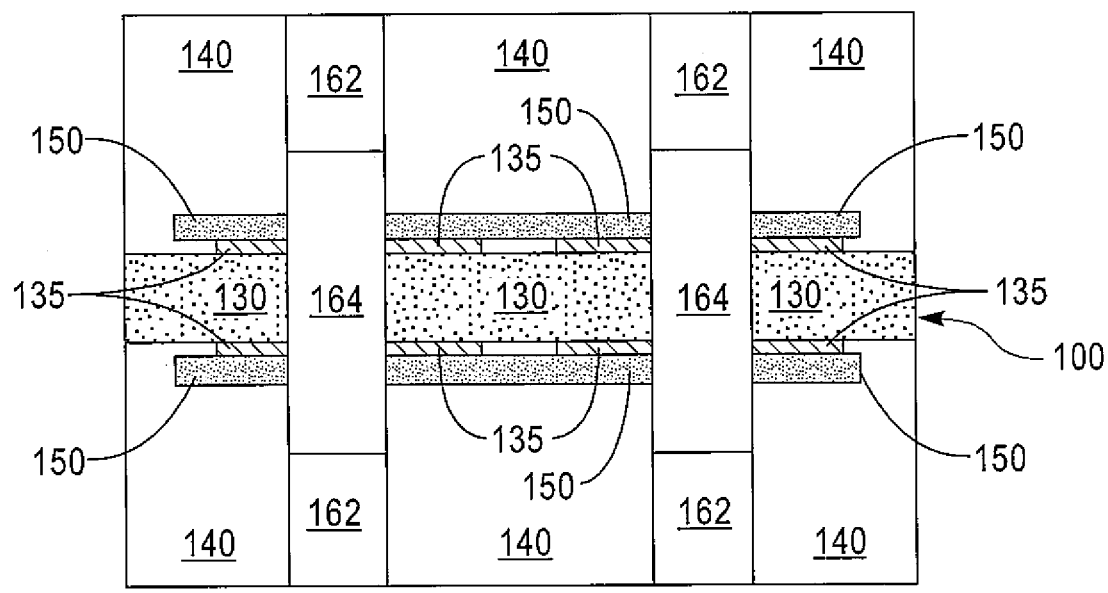
FIG. 15 is a top view of the schematic representation of FIG. 14.

As shown in FIGS. 14 and 15, the portions of the field oxide layer 155 disposed on the BOX layer 125 and below the stop layer 130 (and not removed by the CMP process) can be removed by a wet-etch technique such as acid wash with hydrofluoric acid (HF). Also, portions of the sidewall oxide mask 135 may be also removed.

After removal of the field oxide layer 155, one or more gate stacks 160 are formed over the fins 150 and the mandrel 100. In embodiments in which the gate stack 160 is formed as a replacement metal gate (RMG), a dummy gate structure is formed from hardmask material and sacrificial gate material, the dummy gate structure being used as a placeholder which is subsequently removed (e.g., by reactive ion etching) and replaced with a metal gate structure (e.g., using any suitable metal deposition process). In embodiments in which the gate stack 160 is formed for gate-first flow, both metal gate material and polysilicon gate material may be deposited, and the polysilicon gate material and portions of the metal gate material are subtractively etched. In either embodiment of formation of the gate stack 160, the gate stack 160 is aligned with the laterally grown III-V material of the fins 150. The gate stack 160 may be deposited over the III-V material defining the fins 150 on the sides of the mandrel 100 as well as over the top surface of the planarized stop layer 130 such that the gate stack 160 is defined by lower gate portions 162 extending from the sides of the fins 150 as well as an upper gate portion 164 extending from upper surfaces of the lower gate portions 162 and across the III-V material and the stop layer 130 on the mandrel 100.

Figure 16:
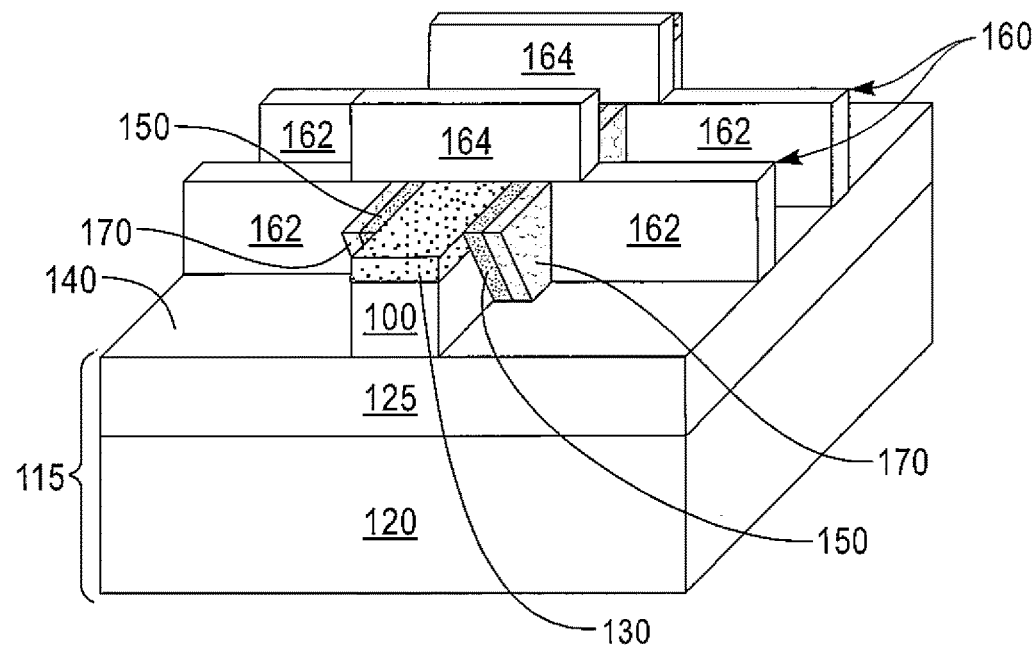
FIG. 16 is a perspective schematic representation of the mandrel/fin arrangement and gate stacks of FIG. 14 having source/drain regions disposed thereon.
Figure 17:
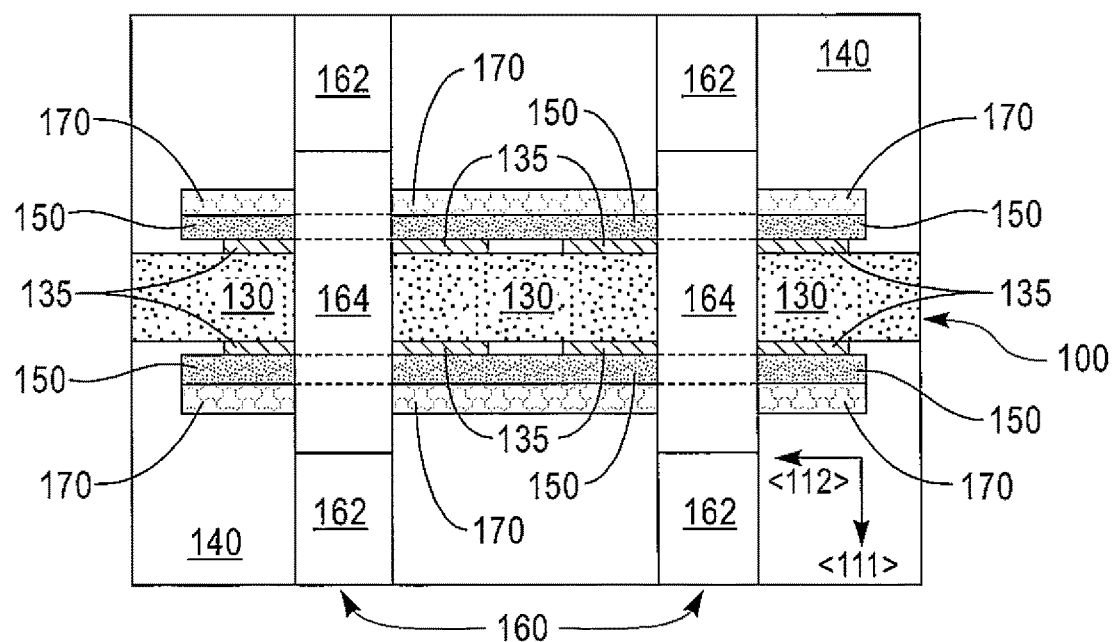
FIG. 17 is a top view of the schematic representation of FIG. 16.

As shown in FIGS. 16 and 17, n+ source and drain regions 170 may be formed on the sides of the III-V material of the fins 150. The source and drain regions 170 may be formed via epitaxially grown n-type doped III-V material or doping from ion implantation into the III-V material. As can be seen in FIG. 17, the III-V material may be continuous in the <112> direction along the sides of the mandrel 100, whereas the source and drain regions 170 may be discontinuous in the <112> directions along the sides of the III-V material of the fins 150 and separated by the lower gate portions 162.

Figure 18:
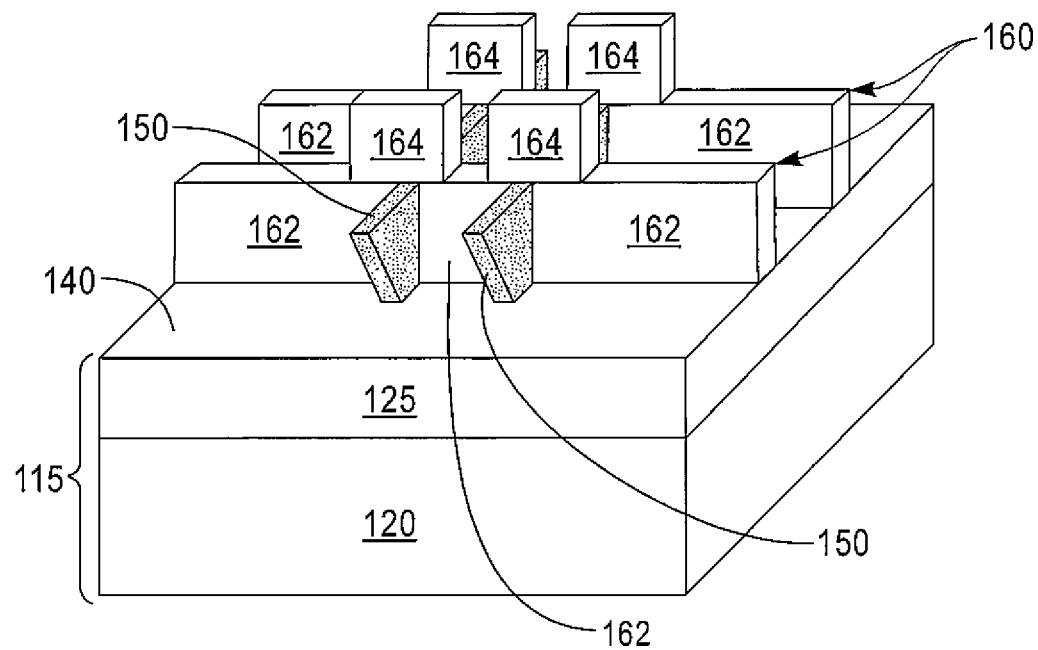
FIG. 18 is a perspective schematic representation of an exemplary embodiment of fins and gate stacks without a mandrel.
Figure 19:
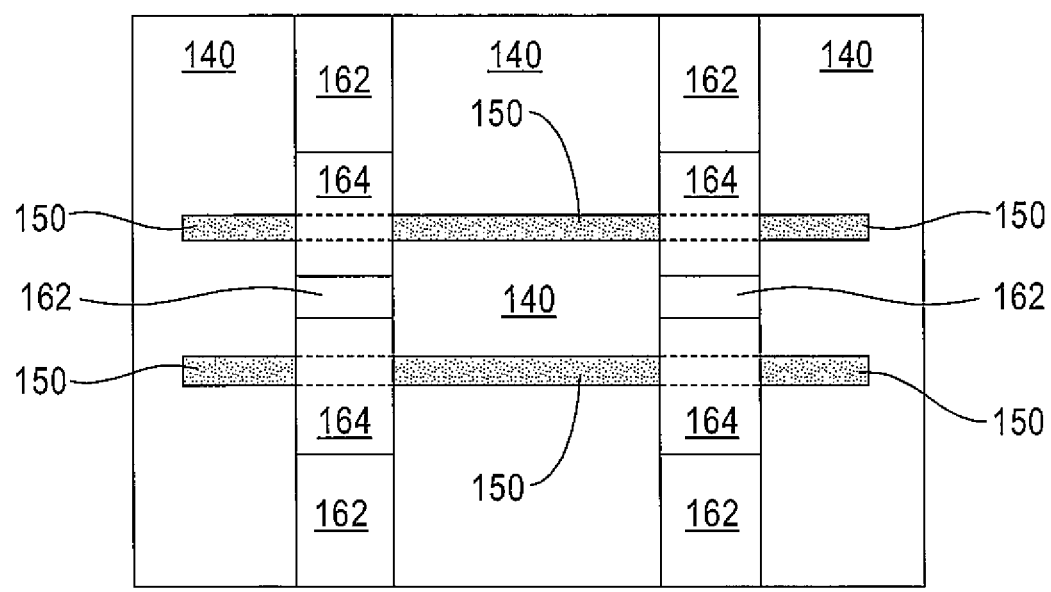
FIG. 19 is a top view of the schematic representation of FIG. 18.

As shown in FIGS. 18 and 19, in another exemplary embodiment, the mandrel 100 can be removed prior to the formation of the gate stack 160 over the fins 150. In such an embodiment, the mandrel 100 may be removed by subjecting the mandrel 100 to an anisotropic selective wet-etch technique (e.g., TMAH, KOH, ammonium hydroxide ($NH_4OH$), or the like) or a dry-etch technique (e.g., $XeF_2$ or the like). Upon removal of the mandrel 100, the gate stack 160 is formed laterally over and between the parallel fins 150 previously formed on each opposing side of the mandrel 100. In this embodiment, lower gate portions 162 are not only formed to extend outward from the fins 150, but also between the fins 150. Also, the upper gate portion 164 may be comprised of two portions.

Figure 20:
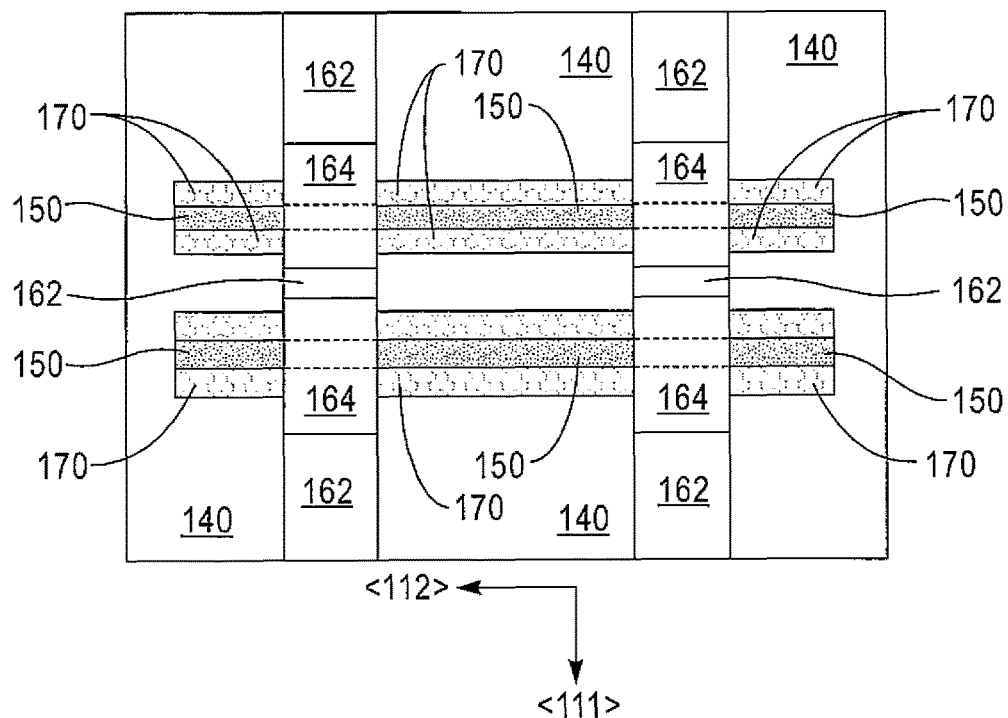
FIG. 20 is a top view of the schematic representation of FIG. 18 having source/drain regions disposed on the fins.

As shown in FIG. 20, n+ source and drain regions 170 may be formed on both sides of the III-V material of the fins 150. The source and drain regions 170 may be formed via an epitaxy process or by ion implantation. As can be seen in FIG. 20, the III-V material may be continuous in the <112> direction under the upper gate portions 164, whereas the source and drain regions 170 may be discontinuous in the <112> directions along the sides of the III-V material of the fins 150 and separated by the lower gate portions 162.

Figure 21:
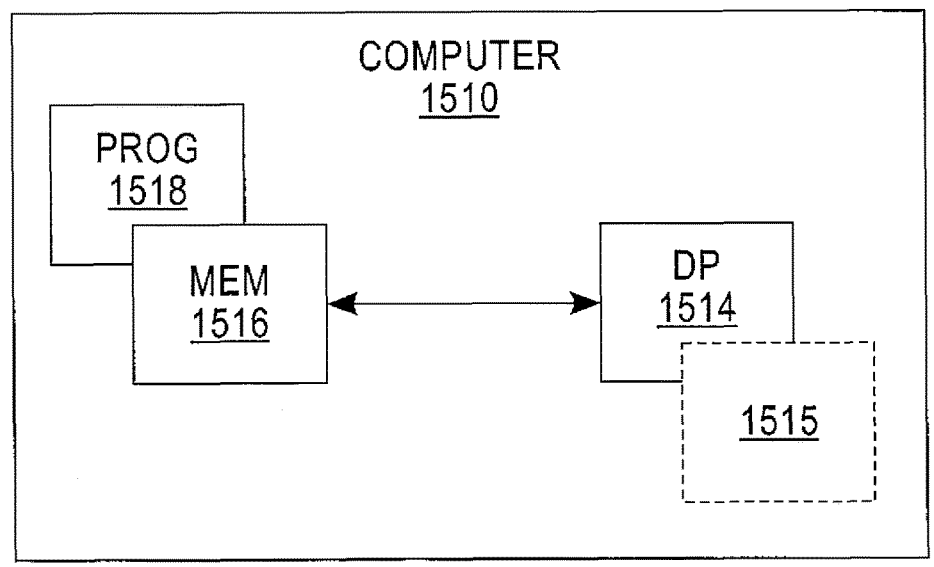
FIG. 21 is a block diagram of various electronic devices and apparatuses that may be suitable for use in forming the structures described herein.

Referring now to FIG. 21, a simplified block diagram of various electronic devices and apparatuses that are suitable for use in practicing the exemplary embodiments described herein is shown. For example, a computer 1510 may be used to control one or more of the processes as described above. The computer 1510 includes a controller, such as a computer or a data processor (DP) 1514 and a computer-readable memory medium embodied as a memory (MEM) 1516 that stores a program of computer instructions (PROG) 1518.

The PROG 1518 includes program instructions that, when executed by the associated DP 1514, enable the various electronic devices and apparatuses to operate in accordance with exemplary embodiments. That is, various exemplary embodiments may be implemented at least in part by computer software executable by the DP 1514 of the computer 1510, or by hardware, or by a combination of software and hardware (and firmware).

The computer 1510 may also include dedicated processors, for example a processor 1515 that controls the conditions for growth of the III-V material from the seed areas 145.

The computer readable MEM 1516 may be of any type suitable to the local technical environment and may be implemented using any suitable data storage technology, such as semiconductor based memory devices, flash memory, magnetic memory devices and systems, optical memory devices and systems, fixed memory, and removable memory. The DP 1514 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

Based on the foregoing, it should be apparent that various exemplary embodiments provide methods to generate fins by substantially lateral growth on a silicon sidewall.

Figure 22:
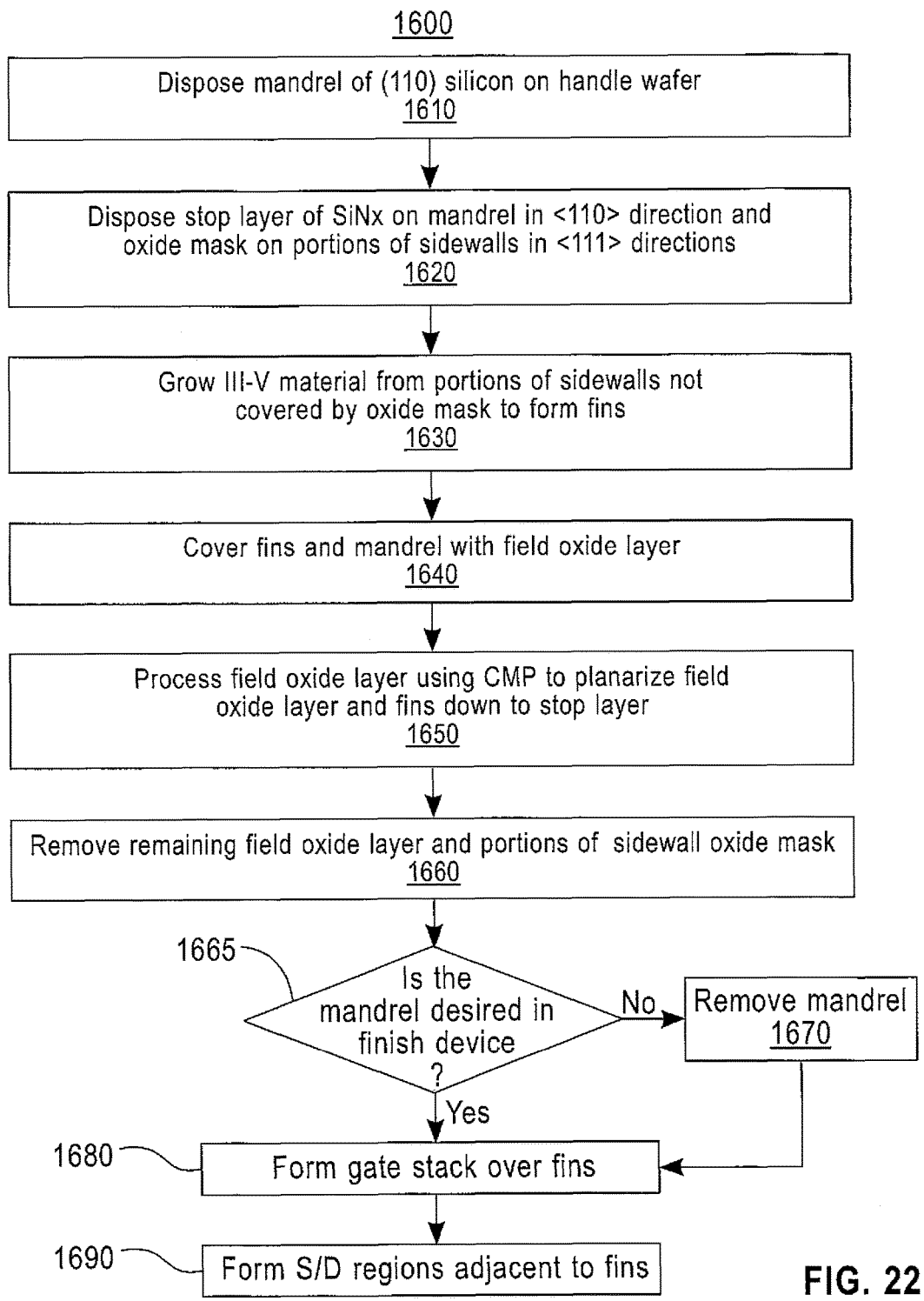
FIG. 22 is a logic flow diagram that illustrates the operation of an exemplary method, and a result of execution of computer program instructions embodied on a computer readable memory, in accordance with an exemplary embodiment of the manufacture of structures described herein.

FIG. 22 is a logic flow diagram that illustrates the operation of one exemplary embodiment of a method 1600 (and a result of an execution of computer program instructions (such as PROG 1518)), in accordance with the exemplary embodiments. In accordance with these exemplary embodiments, at block 1610, a mandrel of (110) silicon is disposed on a handle wafer. At block 1620, a stop layer of $SiN_x$ is disposed on the silicon of the top of the mandrel (in the <110> direction), and an oxide mask is disposed on portions of the sidewalls of the mandrel (in the <111> directions). At block 1630, III-V material is grown from portions of the sidewalls not covered by the oxide mask, the grown material forming fins. Growth of the fins occurs in both the <110> and <111> directions from nucleation sites. At block 1640, the fins and the mandrel are covered with a field oxide layer. Processing of the field oxide layer using CMP is carried out at block 1650 to planarize the field oxide layer and the fins down to the stop layer. At block 1660, the remaining field oxide layer and portions of the sidewall oxide mask are removed. At 1665, a decision is made as to whether the mandrel is desired in the final finFET or fin-type device. If the mandrel is not desired, the mandrel is removed at block 1670, and control passes to block 1680 to form a gate stack over the fins. If the mandrel is desired at 1665, control passes directly to block 1680. At block 1690, source/drain regions are formed adjacent to the fins.

The various blocks shown in FIG. 16 may be viewed as method steps, and/or as operations that result from operation of computer program code, and/or as a plurality of coupled logic circuit elements constructed to carry out the associated function(s).

In one exemplary embodiment, a method comprises providing a structure defined by a silicon material on a buried oxide layer of a substrate; causing a nucleation of a III-V material in a sidewall of the structure defined by the silicon material; adjusting a growth condition to facilitate a first growth rate of the III-V material in directions along a surface of the sidewall and a second growth rate of the III-V material in a direction laterally from the surface of the sidewall, wherein the second growth rate is less than the first growth rate; and processing the silicon material and the III-V material to form a fin.

The method may further comprise forming a source region and a drain region on opposing sides of the fin and forming a gate extending across the fin between the source region and the drain region. Forming a source region and a drain region may comprise doping using one or more of an epitaxy process and an ion implantation process. Processing the silicon material and the III-V material to form a fin may comprise disposing an oxide layer over the structure defined by a silicon material and the buried oxide layer, planarizing the oxide layer and the fin, and removing excess oxide layer using a wet-etch technique (e.g., an acid wash). The method may further comprise removing the structure defined by a silicon material. The silicon material may be either a (110) silicon material or a (112) silicon material.

In another exemplary embodiment, a method comprises providing a structure defined by a silicon material on a buried oxide layer of a substrate, the structure having at least one sidewall perpendicular to a surface of the buried oxide layer and a top surface parallel to the surface of the buried oxide layer; disposing a discontinuous oxide mask on the at least one sidewall of the structure to define at least one seed area at at least one discontinuity in the oxide mask; causing a nucleation of a III-V material in the at least one seed area; adjusting a growth condition to facilitate a first growth rate of the III-V material along the sidewall and a second growth rate of the III-V material lateral to the sidewall, wherein the second growth rate is less than the first growth rate; processing the silicon material and the III-V material to form a fin; and disposing a gate over the formed fin.

Providing a structure defined by a silicon material on a buried oxide layer of a substrate may comprise forming a mandrel by a facet-selective wet etch of the silicon material. The method may further comprise forming the buried oxide layer by ion implantation. Causing a nucleation of a III-V material in the at least one seed area may comprise depositing the III-V material on the seed area at a preselected temperature and pressure to initiate growth of III-V material. The method may further comprise forming a source region and a drain region in the buried oxide layer proximate opposing ends of the gate. Forming a source region and a drain region in the buried oxide layer may comprise forming n+ source and drain regions via epitaxially grown n+ III-V material and/or by ion implantation into the III-V material. Processing the silicon material and the III-V material to form a fin may comprise disposing a field oxide layer over the silicon material and the III-V material and planarizing the field oxide layer and the III-V material down to a stop layer of a silicon nitride on the top surface of the sidewall of the structure. The method may further comprise removing the structure defined by the silicon material after forming the gate over the formed fin. The silicon material may be either a (110) silicon material or a (112) silicon material.

In another exemplary embodiment, a method comprises forming a mandrel on a buried oxide layer on a silicon substrate, the forming of the mandrel being by a facet-selective wet etch of a (110) silicon material, the mandrel having at least one sidewall perpendicular to a surface of the buried oxide layer, the sidewall having a top surface extending in a <110> direction orthogonal to the surface of the buried oxide layer and a side surface extending in a <111> direction parallel to a surface of the buried oxide layer; disposing an oxide mask on the at least one sidewall of the mandrel in the <111> direction to define at least one seed area; causing a growth of a III-V material on the at least one sidewall of the mandrel from the at least one seed area in the <110> and <112> directions and in the <111> direction; adjusting a growth condition to facilitate a faster growth rate of the material in the <110> and <112> directions and a slower growth rate in the <111> direction; processing the (110) silicon material and the III-V material to form a fin; and disposing a gate stack over the formed fin.

Causing a growth of a III-V material on the at least one sidewall of the mandrel from the at least one seed area in the <110> direction and in the <111> direction may comprise depositing the III-V material on the at least one seed area at a preselected temperature and pressure. After growth of the III-V material on the at least one sidewall of the mandrel, the III-V may be substantially defect-free. The method may further comprise removing the mandrel after disposing the gate stack over the formed fin, the removing of the mandrel being by subjecting the mandrel to a selective wet-etch or dry-etch technique. The III-V material may comprise a material selected from the group consisting of gallium arsenide (GaAs), aluminum arsenide (AlAs), indium gallium arsenide (InGaAs), indium phosphide (InP), gallium phosphide (GaP), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium arsenide antimony phosphide (InAsSbP), indium gallium aluminum phosphide (InGaAlP), and combinations of the foregoing.

The foregoing description has provided by way of exemplary and non-limiting examples a full and informative description of the best method and apparatus presently contemplated by the inventors for carrying out various exemplary embodiments. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments.

Furthermore, some of the features of the preferred embodiments could be used to advantage without the corresponding use of other features. As such, the foregoing description should be considered as merely illustrative of the principles, and not in limitation thereof.

What is claimed is:

1. A method, comprising:
    providing a structure defined by a silicon material on a buried oxide layer of a substrate, the structure having at least one sidewall perpendicular to a surface of the buried oxide layer and a top surface parallel to the surface of the buried-oxide layer;
    disposing a discontinuous oxide mask on the at least one sidewall of the structure to define at least one seed area at at least one discontinuity in the oxide mask;
    causing a nucleation of a III-V material in the at least one seed area;
    adjusting a growth condition to facilitate a first growth rate of the III-V material along the sidewall and a second growth rate of the III-V material lateral to the sidewall, wherein the second growth rate is less than the first growth rate;
    processing the silicon material and the III-V material to form a fin; and
    disposing a gate over the formed fin.

2. The method of claim 1, wherein providing a structure defined by a silicon material on a buried oxide layer of a substrate comprises forming a mandrel by a facet-selective wet etch of the silicon material.

3. The method of claim 2, further comprising forming the buried oxide layer by ion implantation.

4. The method of claim 1, wherein causing a nucleation of a III-V material in the at least one seed area comprises depositing the III-V material on the seed area at a preselected temperature and pressure to initiate growth of III-V material.

5. The method of claim 1, further comprising forming a source region and a drain region in the buried oxide layer proximate opposing ends of the gate.

6. The method of claim 5, wherein forming a source region and a drain region in the buried oxide layer comprises forming n+ source and drain regions via epitaxially grown n+ III-V material and/or by ion implantation into the III-V material.

7. The method of claim 1, wherein processing the silicon material and the III-V material to form a fin comprises disposing a field oxide layer over the silicon material and the III-V material and planarizing the field oxide layer and the III-V material down to a stop layer of a silicon nitride on the top surface of the sidewall of the structure.

8. The method of claim 7, further comprising using a wet-etch technique to remove the field oxide layer.

9. The method of claim 1, further comprising removing the structure defined by the silicon material after disposing the gate over the formed fin.

10. The method of claim 9, wherein removing the structure defined by the silicon material comprises etching the structure.

11. The method of claim 10, wherein etching the structure comprises using a selective wet-etch technique.

12. The method of claim 11, wherein the wet-etch technique comprises using one or more of TMAH, KOH, and ammonium hydroxide.

13. The method of claim 10, wherein etching the structure comprises using a selective dry-etch technique.

14. The method of claim 13, wherein the dry-etch technique comprises using $XeF_2$.

15. The method of claim 1, wherein the silicon material is either a (110) silicon material or a (112) silicon material.

16. The method of claim 1, wherein the III-V material comprises a material selected from the group consisting of gallium arsenide (GaAs), aluminum arsenide (AlAs), indium gallium arsenide (InGaAs), indium phosphide (InP), gallium phosphide (GaP), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium arsenide antimony phosphide (InAsSbP), indium gallium aluminum phosphide (InGaAlP), and combinations of the foregoing.

* * * * *